United States Patent [19]
Worley

[11] Patent Number: 5,391,984
[45] Date of Patent: Feb. 21, 1995

[54] METHOD AND APPARATUS FOR TESTING INTEGRATED CIRCUIT DEVICES

[75] Inventor: James L. Worley, Flower Mound, Tex.

[73] Assignee: SGS-Thomson Microelectronics, Inc., Carrollton, Tex.

[21] Appl. No.: 786,504

[22] Filed: Nov. 1, 1991

[51] Int. Cl.⁶ ............................................. G01R 31/28
[52] U.S. Cl. ................................ 324/158.1; 324/73.1; 371/27
[58] Field of Search ............ 324/158 P, 158 F, 158 R, 324/73.1; 371/27, 28

[56] References Cited

U.S. PATENT DOCUMENTS

| | | | |
|---|---|---|---|
| 3,492,572 | 1/1970 | Jones et al. | 371/28 |
| 4,402,055 | 8/1983 | Lloyd et al. | 324/73.1 |
| 4,606,025 | 8/1986 | Peters et al. | 324/73.1 |
| 4,639,664 | 1/1987 | Chiu et al. | 324/73.1 |
| 4,656,632 | 4/1987 | Jackson | 371/27 |
| 4,736,374 | 4/1988 | Kump et al. | 324/73.1 |
| 4,763,124 | 8/1988 | Kovacs et al. | 324/73.1 |
| 4,871,963 | 10/1989 | Cozzi | 324/158 F |
| 4,931,723 | 6/1990 | Jeffrey et al. | 371/22.3 |
| 4,945,302 | 7/1990 | Janum | 324/73.1 |
| 4,985,673 | 1/1991 | Horie | 324/158 R |
| 4,994,732 | 2/1991 | Jeffrey et al. | 324/158 R |
| 5,003,156 | 3/1991 | Kilpatrick et al. | 324/158 F |
| 5,012,187 | 4/1991 | Littlebury | 324/158 F |
| 5,025,205 | 6/1991 | Mydill et al. | 324/158 R |
| 5,029,168 | 7/1991 | Chan | 324/73.1 |
| 5,032,789 | 7/1991 | Firooz et al. | 324/158 F |
| 5,034,684 | 7/1991 | Misui et al. | 324/73.1 |
| 5,091,693 | 2/1992 | Berry et al. | 324/158 P |

*Primary Examiner*—Ernest F. Karlsen
*Attorney, Agent, or Firm*—Kenneth C. Hill; Lisa K. Jorgenson; Richard K. Robinson

[57] ABSTRACT

A relatively large number of test fixtures are provided for an available tester. The tester is programmed to access the individual test fixtures independently, and does so only when the devices connected to them are to be tested. When the test fixtures are not in such a test mode, local power sources provided for each fixture are used to apply stress voltages to the devices being tested. This frees the tester from the requirement for providing stressing voltages to the devices, allowing it to be efficiently used to perform testing on a larger number of devices concurrently.

8 Claims, 2 Drawing Sheets

METHOD AND APPARATUS FOR TESTING INTEGRATED CIRCUIT DEVICES

BACKGROUND OF THE INVENTION

1. Field of the Invention

The present invention relates generally to integrated circuit devices, and more specifically to test equipment for testing such devices.

2. Description of the Prior Art

It is well known in the field of integrated circuit devices that proper testing of devices during and after fabrication is important to improving the reliability and yield of product shipped to customers. Many tests can be performed at wafer probe prior to separating the individual integrated circuit devices and packaging them for final shipment. Identification of non-functional and marginal devices at this stage avoids the expense of packaging undesirable devices.

Overall cost is a significant factor in the success of integrated circuit products. It is desirable to keep testing costs low, since these add directly to the cost of producing the parts. However, the cost of testing cannot be lowered too far, as doing so comes at the expense of product reliability.

The equipment used for testing integrated circuit devices is relatively expensive. Parametric testers used for wafer probe typically have a limited number of test stations. An example of such a testing apparatus is a Keithley System 350.

One type of test performed on integrated circuit devices at wafer probe is end of life testing. DC voltages are applied to the devices being tested to stress them, followed by measuring parameters such as $V_T$ and transistor gain for test (devices provided on the integrated circuit chip. The precise tests performed depend on the nature of the device. All such testing is similar in that stressing voltages are applied to the devices for a relatively long time compared to the time required to perform the parametric tests.

Testing equipment such as the Keithley tester described above is flexible, programmable, and fairly expensive. It is inefficient to use such equipment for the relatively simple tests used in end of life testing. Alternative approaches have been tried, in which devices are stresses separately in equipment designed specifically for this purpose, and then transferred to the more expensive testing equipment for testing. However, this approach has some problems. These include inaccuracies introduced by the handling required. In addition, it has been observed that some of the problems which may occur are partially "healed" as a result of exposure to light. Thus, marginal or defective chips could be tested and scored as passing even though they do not actually satisfy the required test parameters.

It would be desirable to provide a method and apparatus for testing relatively large numbers of integrated circuit devices at wafer level without requiring additional complex equipment. Such method and apparatus should be accurate, efficient, and relative inexpensive.

SUMMARY OF THE INVENTION

Therefore, in accordance with the present invention, a relatively large number of test fixtures are provided for an available tester. The tester is programmed to access the individual test fixtures independently, and does so only when the devices connected to them are to be tested. When the test fixtures are not in such a test mode, local power sources provided for each fixture are used to apply stress voltages to the devices being tested. This frees the tester from the requirement for providing stressing voltages to the devices, allowing it to be efficiently used to perform testing on a larger number of devices concurrently.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
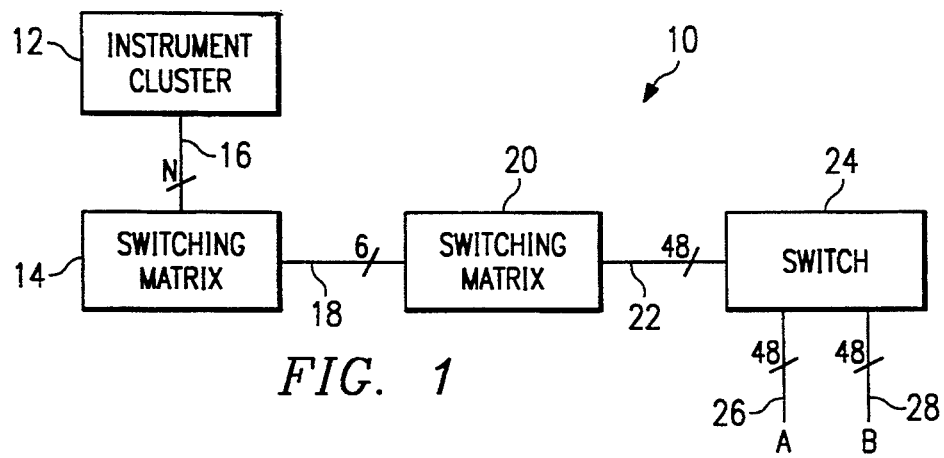
FIG. 1 is a block diagram of a testing apparatus.

Referring to FIG. 1, a testing apparatus is referenced generally with reference number 10. Testing apparatus 10 is preferably equipment for parametric testing of integrated circuit devices at the wafer probe stage. Such equipment is preferably available on the open market as known in the art, and can be, for example, a Keithley parametric tester, Model No. 350. Other models of test equipment are available from the same manufacturer and other manufacturers, and are suited for use with the present invention as will become apparent to those skilled in the art.

In its normal configuration, as provided by the manufacturer, the test equipment 10 as described above includes an instrument cluster 12 connected to an instrument switching matrix 14. The cluster 12 and switching matrix 14 are connected by a number, "N", of signal lines 16 which is preferably related to the number of instruments available in a cluster 12. Instrument cluster 12 can be configured by the user to contain a large variety of different types of instruments useful in parametric testing of integrated circuit devices. These include voltmeters, ammeters, and voltage supply sources. The number of instruments in a cluster 12 depends on the configuration adopted by any given user. For some number, N, of instruments in a cluster 12, there will be a corresponding number of signal lines 16 connected to the switching matrix 14.

Switching matrix 14 serves to connect any one of the signal lines 16 to any one of the outgoing signal lines 18. In some models of test equipment only six signal lines 18 are provided, while greater numbers are provided in other models. The signal lines 18 are in turn connected to a pin switching matrix 20. Switching matrix 20 serves to connect any one of the 6 signal lines 18 with any one or more of the signal lines 22 which are also connected to a two-way switch 24. For purposes of the described example, 48 signal lines 22 will be described, but greater or lesser numbers are available on various equipment as known in the art.

Two-way switch 24 connects all of the signal lines 22 to either A station signal lines 26 or B station signal lines 28. Each station, A or B, has the same number of signal lines as are available as signal lines 22. The switch 24 allows the instrument cluster to be connected to either station A or station B for testing purposes. The instruments in cluster 12 cannot be connected to both station A and station B at the same time.

Since the instruments in cluster 12 can only be connected to one station at a time, only a single device can be stressed in order to perform lifetime parametric testing. Thus, the general purpose programmable parametric tester is limited to testing a single device at one time. This is a very inefficient use of a highly capable machine, but to modify it to be able to handle multiple devices is an expensive undertaking.

Figure 2:
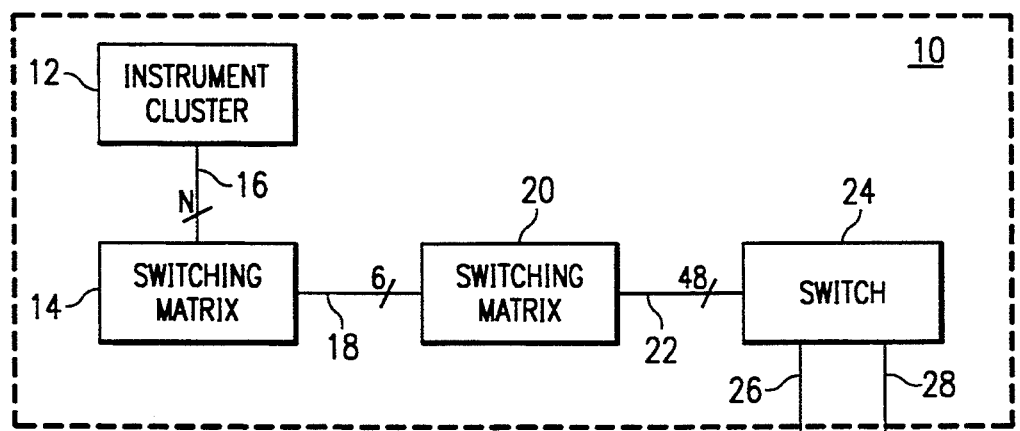
FIG. 2 is a block diagram of a modified testing apparatus according to the present invention.

Referring to FIG. 2, a system is shown which allows use of the testing apparatus 10 for simultaneously stressing and testing multiple devices. The signal lines 26, 28 are divided into sets of 16 signal line 30 defining six test stations A through F. For purposes of the lifetime parametric testing to be described below, sixteen signal lines are needed for each test station. However, depending upon the devices to be tested and the test to be performed, different numbers of lines may be required. In such event, the numbers of lines in each set of signal lines 30 would be changed as required. For example, if 10 signal lines were required for each test station, and each set of signal lines to the A and B stations out of the switch 24 contained 60 lines, a total of 12 stations could be supported using the current configurations.

Figure 3:
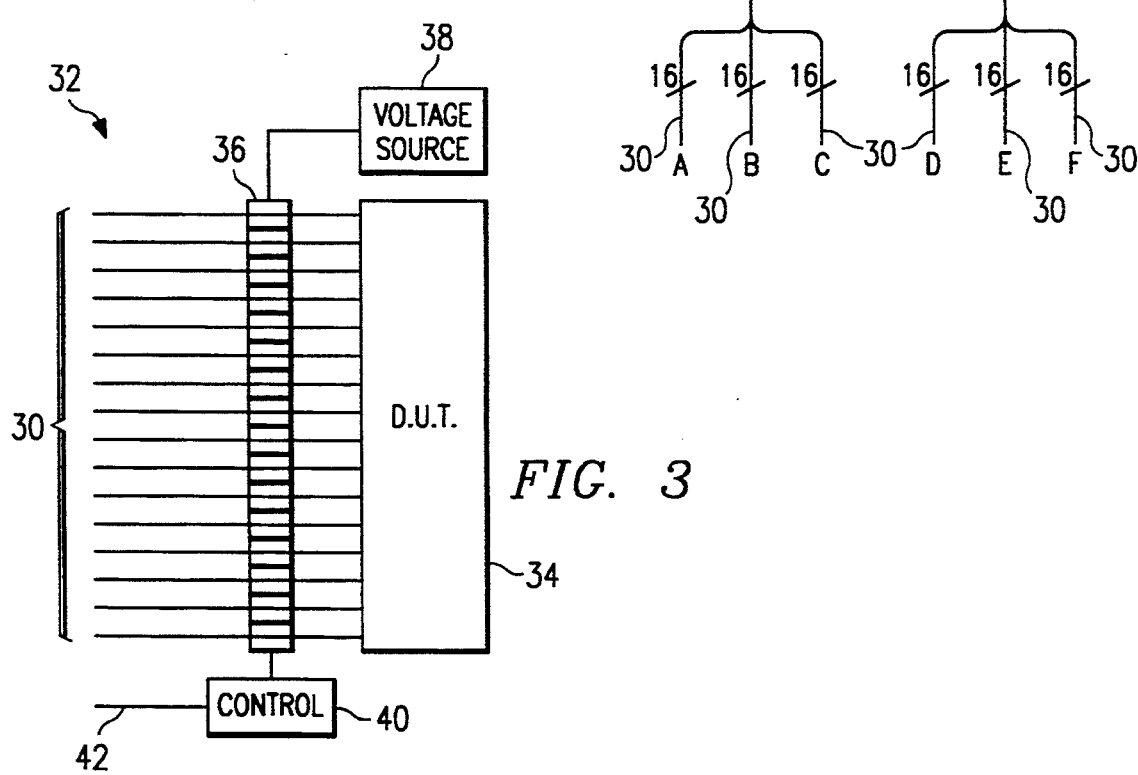
FIG. 3 is a schematic block diagram of one test fixture.

Referring to FIG. 3, one test fixture, corresponding to one of the test stations A through F, is shown. Signal lines 30 are connected to a device under test 34 through switches 36. A voltage source 38 can also be connected to the device under test 34 through switches 36 as will be described in connection with FIG. 4. Control circuitry 40 controls operation of the switches 36, and is in turn controlled by a control signal line 42 which is connected to the testing apparatus 10.

The device under test 34 is not actually located at the test fixture. Instead, it is generally contained in a separate fixture which is probed using wafer probe equipment as known in the art. The electrical signals connected to the probe tips are connected to the signal lines 30 on the test fixture 32, and are represented by the device under test block 34.

The function of the voltage source 38 is to apply stressing voltages, either AC or DC as required, to the device under test to stress it. This allows the device under test 34 to be stressed independently of the action of the testing apparatus 10. When it is time to test the particular device 34 on a given test fixture, the voltage source 38 is removed from the device under test 34, and testing is performed by the testing apparatus 10 over the signal lines 30.

Figure 4:
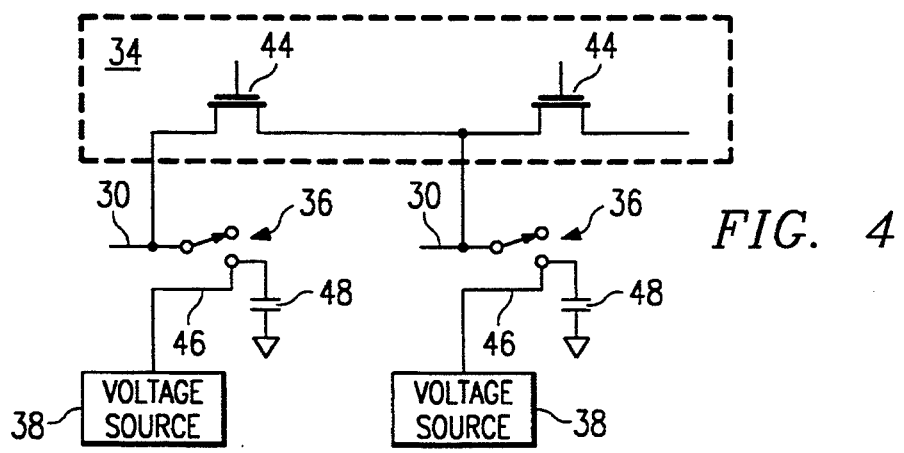
FIGS. 4 and 5 are schematic diagrams of portions of the tester of FIG. 3.

Referring to FIG. 4, a preferred embodiment is shown for an implementation of the switches 36. The device under test 34 contains a plurality of transistors 44, of which only two are shown. Various parameters of these test transistors 44, such as threshold voltages ($V_T$) and transistor gains, are checked and used to determine the functionality of the entire device. These values degrade over time with electrical stressing, and variation of these and other parameters after stressing indicates how the remainder of the device will function over its expected lifetime. Testing of these transistors is extremely well known in the art, and the precise tests used do not form a part of the present invention.

Voltage sources 38 are connected to the switches 36, which are shown as relays but could be any other type of suitable switch, by signal lines 46. Capacitors 48 are also connected to the signal lines 46, and are used to ensure that a clean signal is supplied from the voltage sources 38. When the fixture 32 is in the stress mode, the switches 36 are closed to connect the voltage sources 38 to the device under test 34. During stressing, it may not be necessary to connect all of the signal lines 46 to a voltage supply. Depending on the layout of the test transistors 44 and the tests being performed, some of the signal lines 46 will be grounded, and others will be left floating. The voltage source 38 can provide several different voltages, which can be routed to the appropriate signal lines 46.

When the fixture 32 is in the testing mode, all of the switches 36 are opened, disconnecting all of the power supplies from the device under test 34. This allows the testing apparatus 10 to supply appropriate test voltages to the device under test 34 and read voltages at various test points. This in turn allows the electrical parameters of the device to be characterized as known in the art. After a test is completed, the test fixture 32 can be returned to the stress mode for further electrical stressing.

The signal lines 30 are connected to the device under test 34 at all times. The testing apparatus 10 ignores any voltages on the signal lines 30 other than those in use at any given time for a test fixture 32 in test mode, so any voltages applied to the lines 30 by supplies connected while in the stressing mode are ignored.

Since the power sources used for stressing the devices are independent of the testing apparatus 10, numerous devices can be tested in parallel with a single testing apparatus 10. The test apparatus 10 is programmed to read the signal lines corresponding to each of the devices in turn after an appropriate stressing period. This is done using standard programming of the switching matrices 14, 18 as known in the art. Since switching from test mode to stress mode is so simple, multiple stress-test cycles can be performed on each device. This contrasts with prior art techniques, in which a single test-stress-test cycle is all that is usually performed.

Figure 5:
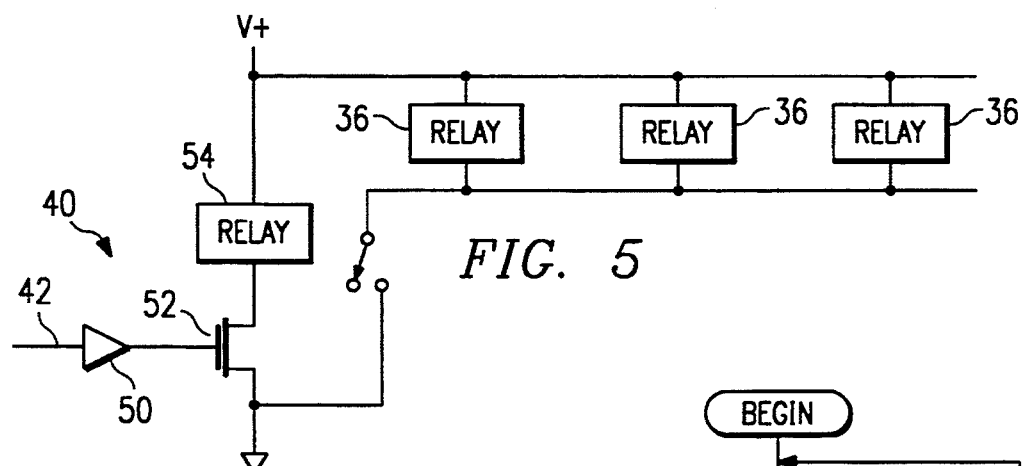

Referring to FIG. 5, a preferred embodiment of a simple control circuit 40 is shown. The signal line 42 from the testing apparatus 10 is connected to an input buffer 50, which in turn drives a transistor 52. Transistor 52 is connected to the activation coil of a relay 54, which in turn drives the activation coils of all of the relay switches 36. This minimizes the load presented to the testing apparatus 10 over signal line 42. By switching the voltage on signal line 42 between ground and a high value, the mode of the test fixture 32 (test mode or stress mode) is controlled. Since test mode is defined as simply disconnecting all of the power sources 38 form the device under test, simply turning off the transistor 52, thereby opening the switches 36, suffices to place the test fixture 32 in the fixture in the testing mode.

In the preferred embodiment, in which a Keithley testing apparatus is used as described above, the control signal line 42 is preferably supplied by the testing apparatus through a general purpose interface (GPIF) using known programming techniques. When the time comes to test one of the test fixtures 32, the tester 10 simply changes the voltage on the corresponding signal line 42 to change its mode. Only one of the signal lines 42 should be activated at a time, since the testing apparatus can only test one device at a time. Activating more than one signal line will not actually interfere with the testing process, but it means that the remaining devices will not be stressed during this time. If precisely measured stress times are important to the testing regime, this may actually be desirable, so that each device can be held in testing mode, but not yet tested, after the prescribed stress period has been applied.

Figure 6:
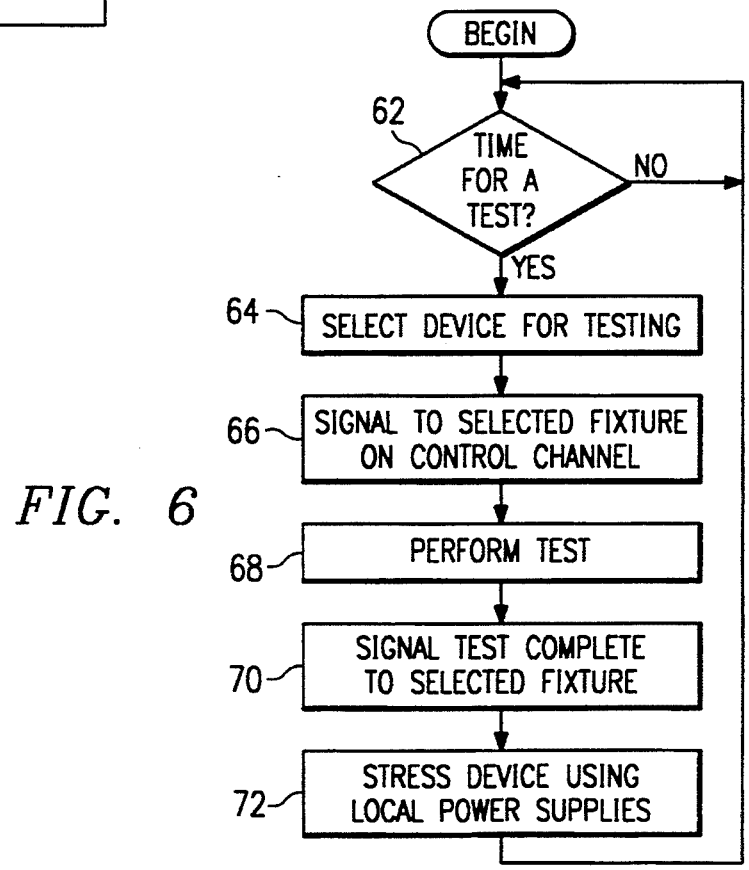
FIG. 6 is a flow chart illustrating a testing method according to the present invention.

FIG. 6 is a high level flowchart illustrating an algorithm used by the testing apparatus to stress and test several devices. It will be appreciated by those skilled in the art that the net effect of the described technique is to time multiplex the testing of the multiple devices, while simultaneously applying stress voltages to all of those devices not being tested.

Referring to FIG. 6, all of the devices attached to the tester 10 are tested initially to determine their baseline parameters. Once the stress-test cycle begins, a check is made in the tester software to see if it is time to perform a test on any of the devices 62. This may be done using a simple timing loop, or using scheduled interrupts as known in the art. Once a prescribed stressing time has expired for a device, it is selected for testing 64, and the corresponding signal line 42 is driven to change the test fixture 32 into the testing mode 66. The scheduled test procedures are performed 68, and the selected fixture is returned to the stressing mode 70, and the device is stressed using the local power supplies 72. The tester 10 then returns to check for the next devices to be tested, and the cycle continues. As many stress-test cycles as desired may be performed.

The described method and apparatus provide a simple, economical technique for testing multiple devices in parallel using a single testing apparatus which can only test one device at a time. This is possible because each test fixture has a power source which is independent of the testing apparatus. The testing apparatus is responsible only for signalling to the test fixture that it should now switch to test mode, and for actually performing the parametric testing on the device. The described technique can easily be adapted to operate witch many different types of test equipment other than the Keithley equipment described above.

If desired, in a more complex installation, the control circuitry on each test fixture can be provided with enhanced control capabilities. By providing additional control signals to the control circuitry through the GPIF, or some other interface, the control circuitry can be ordered to change the types of voltage stresses applied to the device under test. This allows a more complex testing function to be applied if such is desired.

While the invention has been particularly shown and described with reference to a preferred embodiment, it will be understood by those skilled in the art that various changes in form and detail may be made therein without departing from the spirit and scope of the invention.

What is claimed is:

1. A system for testing integrated circuit devices, comprising:
   a test apparatus containing a plurality of test instruments;
   a plurality of test fixtures for connecting to integrated circuit devices to be tested;
   a plurality of signal lines connecting said test apparatus and each of said test fixtures;
   a local power source, independent of the test apparatus, for each of said test fixtures; and
   control means for each test fixture for placing such test fixture in a stress mode or a test mode, wherein said local power source is connected to an integrated circuit device when said fixture is in a stress mode, wherein said local power source is disconnected from the integrated circuit device when said fixture is in a test mode, and wherein said test apparatus is connected to the device in said test fixture when said test fixture is in test mode.

2. The apparatus of claim 1, wherein said test apparatus comprises:
   the test instruments;
   signal lines connected to the test instruments;
   a switching means for connecting said test instrument signal lines to said signal lines connected to said test fixtures; and
   means for controlling said switching means to connected selected subsets of said signal lines connected to said test fixtures to the test instruments, wherein only one of the devices being tested is connected to the test instruments at any one time.

3. The apparatus of claim 1, wherein said signal lines remain connected to said test apparatus when said test fixtures are in stress mode and in test mode.

4. The apparatus of claim 3, wherein said signal lines carry voltages supplied by said local power sources when said test fixtures are in stress mode, but said test apparatus ignores such stress voltages.

5. The apparatus of claim 1, wherein said test fixtures are connected to wafer probe equipment for testing integrated circuit chips on a semiconductor wafer.

6. The apparatus of claim 1, wherein the test instruments comprise a plurality of instruments for testing transistor electrical parameters.

7. The apparatus of claim 6, wherein the test instruments include instruments for measuring transistor threshold voltages.

8. The apparatus of claim 6, wherein the test instruments include instruments for measuring transistor gain.

* * * * *